(12) United States Patent
Mouri et al.

(10) Patent No.: US 6,466,012 B1
(45) Date of Patent: Oct. 15, 2002

(54) MI ELEMENT MADE OF THIN FILM MAGNETIC MATERIAL

(75) Inventors: Kaneo Mouri, Aichi-Ken (JP); Kazuhiko Ueno, Tokyo (JP)

(73) Assignee: Stanley Electric Corporation, Tokyo (JP)

( * ) Notice: Subject to any disclaimer, the term of this patent is extended or adjusted under 35 U.S.C. 154(b) by 0 days.

(21) Appl. No.: 09/537,935

(22) Filed: Mar. 29, 2000

(30) Foreign Application Priority Data

Mar. 30, 1999 (JP) .............................. 11-087672

(51) Int. Cl.$^7$ ............................... G01R 33/02
(52) U.S. Cl. ....................... 324/249; 324/260
(58) Field of Search ................. 324/249, 250, 324/244, 260; 360/110

(56) References Cited

U.S. PATENT DOCUMENTS 5,089,334 A  *  2/1992  Mallary et al. ............. 360/110

* cited by examiner

*Primary Examiner*—Walter E. Snow
(74) *Attorney, Agent, or Firm*—Hogan & Hartson, LLP

(57) ABSTRACT

Here is disclosed a MI element made of thin film magnetic material utilizing a magnetic impedance effect comprising a substrate, first and second magnetic materials successively laminated on a surface of the substrate each in the form of thin film wherein the first magnetic material has its axis of easy magnetization $Jm_1$ declined at an angle of $\alpha°$ and the second magnetic material has its axis of easy magnetization $Jm_2$ declined at an angle of $-\alpha°$ with respect to a reference line Oo which is a direction corresponding to a path of high frequency current Iac so that the axes of easy magnetization of the first and second magnetic materials may intersect each other. Such MI element made of thin film magnetic material obtains linear magnetic field sensor characteristics exhibiting a remarkably large variation of impedance in response to a relatively low external magnetic field without any demand for bias magnetic field.

18 Claims, 6 Drawing Sheets

MI ELEMENT MADE OF THIN FILM MAGNETIC MATERIAL

BACKGROUND OF THE INVENTION

1. Field of the Invention

This invention relates to a MI element utilizing so-called magnetic impedance effect and more particularly to a magnetic sensor technique to construct a magnetic sensor head by two layers of thin film magnetic material having their axes of easy magnetization intersecting each other.

2. Description of the Related Art

There have already been magnetic sensors such as the magnetic resistance (MR) element utilizing a magnetoresistance effect, the sensor of flux-gate type and the magnetic field sensor utilizing a magnetic impedance effect.

The magnetic impedance effect utilizing magnetic field sensor has its head incorporated with a MI element to magnetically record various information and to read out such recorded information. The magnetic field sensor of this type may be more widely used for various applications, for example, as a multipolar magnetization sensor of a rotary encoder for robot control.

The MI element making a part of the magnetic field sensor is a magnetic sensor element utilizing a phenomenon (MI effect) that a surface effect causes the MI element to exhibit an impedance remarkably varying in response to an external magnetic field when the magnetic material forming this MI element is supplied with high frequency current.

There have already been various forms of MI element such as the cylindrical element formed by amorphous wire, the thin film element formed by sputtering amorphous material on a substrate and film laminated sensor formed by sputtering or plating appropriate magnetic material on a substrate. All of them are intended to be used as the micro-dimensioned head.

FIG. 7 of the accompanying drawings is a perspective view partially showing an example of well known MI element made of thin film magnetic material.

This MI element 10 comprises a glass substrate 11 and magnetic material 12 sputtered on a surface of said glass substrate 11 to form thin film.

The magnetic material 12 forming this MI element 10 has been subjected to a process of annealing in magnetic field or a process of sputtering in magnetic field so that its axis of easy magnetization Jm extends at right angles with respect to a direction corresponding to a path of high frequency current Iac (i.e., transversely of the magnetic material 12).

When said MI element 10 made of thin film magnetic material is longitudinally supplied with high frequency current Iac, a magnetization vector oriented transversely of the MI element will be declined longitudinally of said MI element, a transverse magnetic permeability of said MI element will correspondingly vary and an impedance also will vary so far as said MI element is being applied with an external magnetic field Hex longitudinally thereof.

Variation in the transverse magnetic permeability due to the external magnetic field leads to variation in a depth of the surface effect exhibited by the MI element 10.

Accordingly, simultaneous variation of electric resistance and inductance causes the impedance to remarkably vary in response to the external magnetic field Hex.

The MI element 10 of this type is incorporated in a self-oscillator circuit and operated as a magnetic field sensor.

In such application, a variation in the voltage amplitude of said self-oscillator circuit is detected as a variation in the impedance of the MI element 10 dependent on the external magnetic field Hex. This is based on a fact that said variation in the voltage amplitude of said self-oscillator circuit is proportional to said impedance of the MI element 10 and the oscillating frequency is modulated dependent on the external magnetic field Hex.

FIG. 8 is a graphic diagram plotting MI characteristics of said MI element made of thin film magnetic material.

These characteristics indicate a relationship between the external magnetic field Hex and the element's voltage varying coefficient ΔEw/Ewo (%) under a condition of high frequency current Iac=10 mA and frequency f=40 MHz.

As will be understood from FIG. 8, the MI element 10 exhibits symmetrical MI characteristics in response to positive side and negative side of the external magnetic field Hex. A point Hp of the external magnetic field magnitude at which the impedance reaches the maximum value is approximately |12.0| (Oe).

In this graphic diagram, a characteristic curve in solid line indicates MI characteristics obtained when the external magnetic field Hex varies from its negative side to its positive side and a characteristic curve in dotted line indicates MI characteristics obtained when the external magnetic field Hex varies from its positive side to its negative side.

When a linear magnetic field sensor is constructed from said well known MI element 10 made of thin film magnetic material, a pair of MI elements are used. One of these two MI elements is supplied with high frequency current superposed with positive DC current while the other MI element is supplied with high frequency current superposed with negative DC current and both of them are applied with a bias magnetic field.

As will be apparent from FIG. 9, said one MI element exhibits asymmetrical MI characteristics 10A that this MI element has the maximum impedance on positive side of the external magnetic field and the other MI element exhibits asymmetrical MI characteristics 10B that this MI element has the maximum impedance on negative side of the external magnetic field.

A differential output voltage of these two MI elements applied with the bias magnetic field, respectively, may be determined to detect the external magnetic field Hex with linear sensor characteristics. FIG. 10 plots such sensor characteristics.

FIG. 11 is a perspective view partially showing another example of well known MI element 20 made of laminated thin film magnetic material.

This MI element 20 is laminate type and comprises a glass substrate 21, first magnetic material 22 laid as thin film on a surface of said glass substrate 21, a conductive material laid as thin film on a surface of said first magnetic material 22 and second magnetic material 24 laid as thin film on a surface of said conductive material 23.

The conductive material 23 is patterned with a width smaller than said first and second magnetic materials so that this conductive material 23 is wrapped by the second magnetic material 24.

Of this MI element 20, the first and second magnetic materials 22, 24 have, their axes of easy magnetization Jm extending at right angles (transversely of the respective magnetic materials 22, 24) with respect to a direction corresponding to a path of the high frequency current Iac (i.e., the longitudinal direction of the conductive material 23).

With this MI element 20, similarly to the case of the previously described MI element 10, magnetic permeabilities of these first and second magnetic materials vary depending on the external magnetic field Hex when said conductive material 23 is supplied with high frequency current Iac so far as said external magnetic field Hex is being applied to the MI element 20 longitudinally thereof. Upon variation of said magnetic permeabilities, an impedance of said conductive material 23 remarkably varies. Based on this variation of the impedance, a magnitude of the external magnetic field Hex can be detected.

With the well known MI elements as have been described hereinabove, the symmetrical MI characteristics are exhibited in response to the directions, i.e., positive and negative sides of the externally applied magnetic field. To construct a linear magnetic field sensor using such MI elements, it is necessary apply the sensor with bias magnetic field by a fixed magnet or a coil.

Particularly, the level of the external magnetic field's magnitude at which the impedance reaches the maximum value is undesirably high. This is for the reason that the coil for application of said bias magnetic field must be supplied with correspondingly large bias current which inevitably increases an energy consumption and makes it difficult to provide a portable magnetic field sensor.

SUMMARY OF THE INVENTION

In view of the problems as have been described above, it is a principal object of this invention to provide a MI element made of thin film magnetic material adapted to improve a sensor accuracy of said element by exhibiting a remarkable impedance variation in response to a relatively low external magnetic field. Furthermore, it is possible for the MI element disclosed herein by this invention to obtain asymmetrical MI characteristics and thereby to constitute a linear magnetic field sensor without any demand for a fixed magnet or a coil conventionally used to generate a bias magnetic field.

The object set forth above is achieved, according to the principle of this invention, by a magnetic field sensor to detect an external magnetic field and more particularly by a MI element made of thin film magnetic material utilizing so-called magnetic impedance effect for magnetic detection.

The object set forth above is achieved, according to a first aspect of this invention, by a MI element made of thin film magnetic material utilizing a magnetic impedance effect comprising a substrate, first and second magnetic as well as conductive first and second materials successively laminated on a surface of said substrate each in the form of thin film wherein said first magnetic material has its axis of easy magnetization declined in one direction with respect to a direction of current path and said second magnetic material has its axis of easy magnetization declined in the other direction with respect to said direction of current path so that the axes of easy magnetization of said first and second magnetic materials may intersect each other.

The object set forth above is achieved, according to a second aspect of this invention, by a MI element made of thin film magnetic material utilizing a magnetic impedance effect comprising a substrate and a first magnetic material, conductive material and second magnetic material successively laminated on a surface of said substrate each in the form of thin film wherein said first magnetic material has its axis of easy magnetization declined in one direction with respect to a direction of current path and said second magnetic material has its axis of easy magnetization declined in the other direction with respect to said direction of current path so that the axes of easy magnetization of said first and second magnetic materials may intersect each other.

According to a third aspect of this invention, said first magnetic material has its axis of easy magnetization declined at an angle of $\alpha°$ and the second magnetic material has its axis of easy magnetization declined at an angle of $-\alpha°$ with respect to a direction of current path so that these axes of the first and second magnetic materials intersect each other.

According to a fourth aspect of this invention, the angles $\alpha°$ and $-\alpha°$ at which the axes of easy magnetization of the first and second magnetic materials are declined are selected in a range of $0°<\alpha°<180°$.

According to a fifth aspect of this invention, said MI element is supplied with a high frequency current or pulse current superposed with DC current and thereby an asymmetrical MI effect is obtained with respect to positive side and negative side of an external magnetic field.

The MI element made of thin film magnetic material constructed as has been described above detects the external magnetic field as said element is supplied with high frequency current superposed with DC current.

Being supplied with high frequency current, a magnetization vector due to an external magnetic field will be declined, thereby a transverse magnetic permeability of the element will be varied and an impedance of said element also will be varied, so far as there exist said external magnetic field in a direction corresponding to the path of said high frequency current.

In this MI element made of thin film magnetic material, the first and second magnetic materials have their axes of easy magnetization extending so as to intersect each other. Consequently, the impedance effect is asymmetrical in response to positive and negative external magnetic field.

With an advantageous consequence, the MI element according to this invention enables it to realize a linear magnetic field sensor requiring no application of the bias magnetic field.

DESCRIPTION OF THE PREFERRED EMBODIMENTS

This invention will be described by way of examples in reference with the accompanying drawings.

Figure 1:
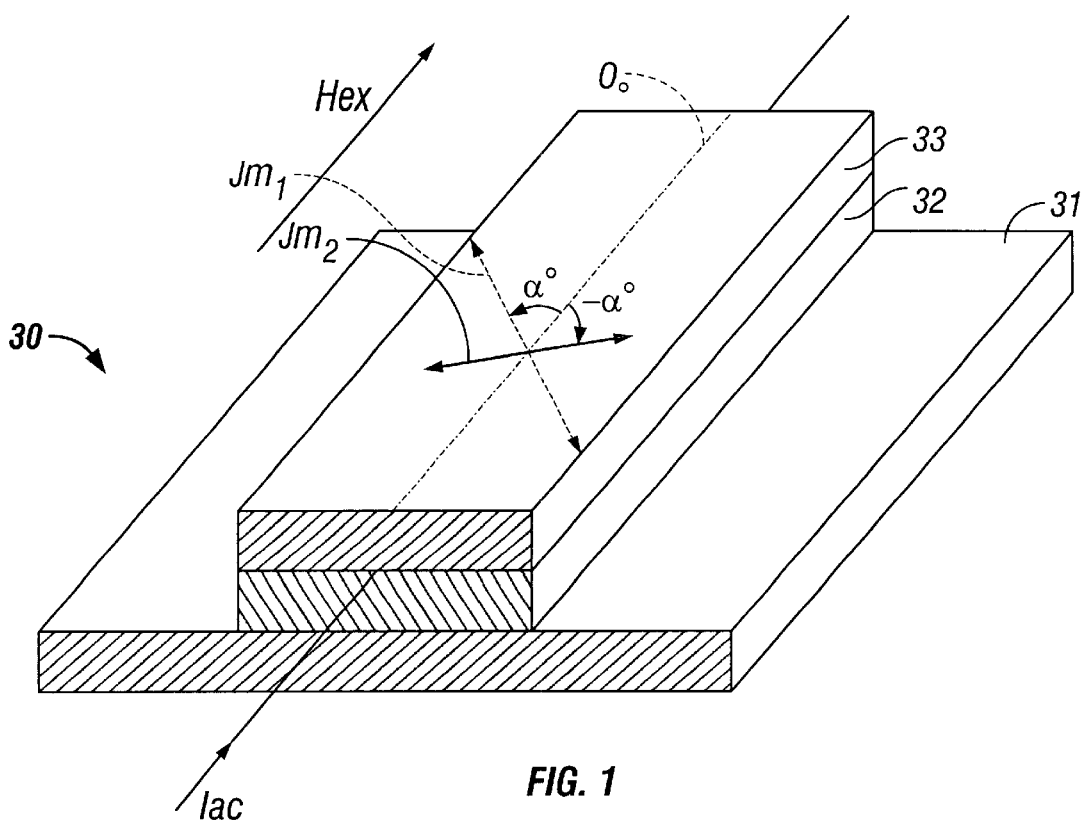
FIG. 1 is a perspective view partially showing a MI element made of thin magnetic material according to a typical embodiment of this invention.

FIG. 1 is a perspective view partially showing MI element made of thin film magnetic material according to a typical embodiment of the invention.

This MI element 30 made of thin film magnetic material comprises a glass substrate 31, thin film of first magnetic material 32 sputtered on a surface of said glass substrate 31 and thin film of second magnetic material 33 sputtered on a surface of said first magnetic material 32. The MI element 30 is finished by subjecting this assembly to a process of photolithographic patterning.

In the MI element 30 made of thin film magnetic material constructed as has been described above, the first magnetic material 32 has its axis of easy magnetization $Jm_1$ extending at an angle of $\alpha°$ and the second magnetic material 33 has its axis of easy magnetization $Jm_2$ extending at an angle of $-\alpha°$ with respect to a reference line O corresponding to a direction of current path.

To achieve such angular relationship, thin film of the first magnetic material 32 is formed under effect of a magnetic field given by a permanent magnet in a direction defined by said angle $\alpha°$ with respect to said reference line $O_o$ and thin film of the second magnetic material 33 is formed under effect of a magnetic field given by the permanent magnet in a direction defined said angle $-\alpha°$ with respect to said reference line $O_o$.

It should be understood that said firs t and second magnetic materials maybe e selected from a group of soft magnetic materials such as amorphous magnetic material, permalloy and microcrystalline material.

The MI element 30 made of thin film magnetic material constructed in this manner detects an external magnetic field Hex applied thereto in a direction of said reference line $O_o$ (i.e., longitudinally of the MI element 30) when said MI element 30 is supplied with a high frequency current Iac superposed with DC current.

Specifically, the external magnetic field Hex declines a magnetization vector and a transverse magnetic permeability of the element 30 correspondingly varies. As a result, an impedance also largely varies.

Accordingly, a variation of impedance occurring in the MI element 30 made of thin film magnetic material may be picked up as a detection voltage to determine a magnitude of the external magnetic field Hex on the basis of said detection voltage.

Figure 2:
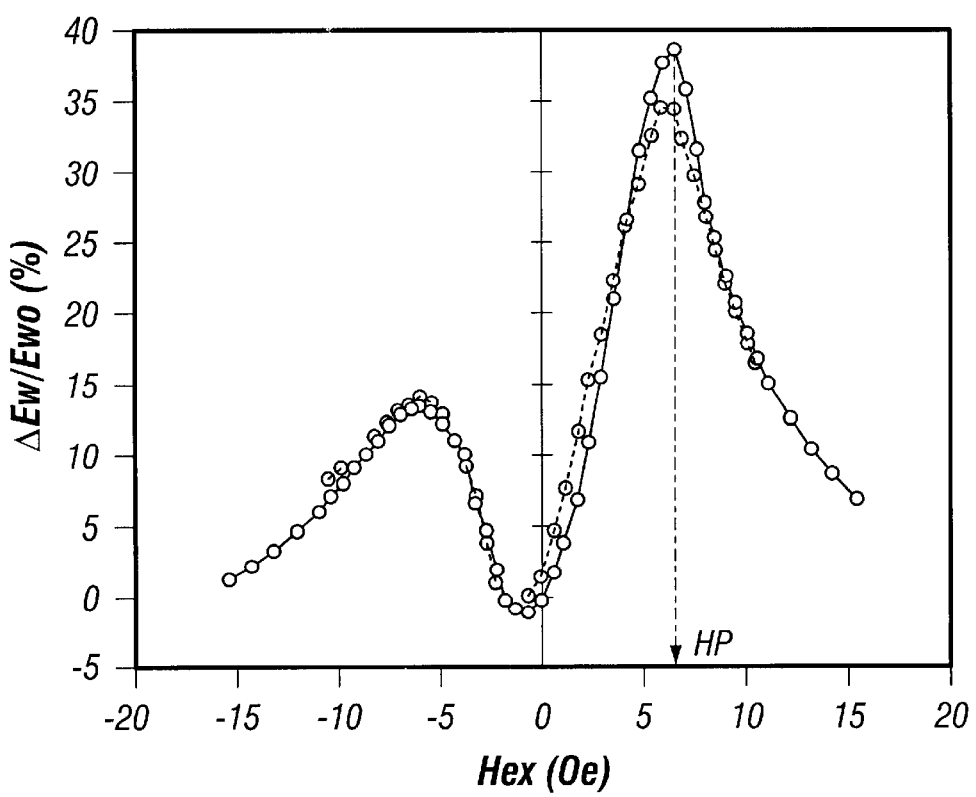
FIG. 2 is a graphic diagram plotting MI characteristics exhibited by said MI element when said MI element is supplied with high frequency current of 5 mA at a frequency f=10 MHz superposed with DC current of 30 mA.

FIG. 2 is a graphic diagram plotting MI characteristics, i.e., a profile of voltage variation appearing in said MI element 30 made of thin film magnetic material depending on the external magnetic field Hex.

This MI characteristic diagram plots a voltage variation coefficient $\Delta Ew/Ewo$ (%) when the MI element 30 is supplied with high frequency current AC=5 mA at a frequency f=10 MHz superposed with DC current=30 mA and the external magnetic field Hex is varied in a range of −20~20 (Oe).

It should be understood that Ewo designates a voltage corresponding to the external magnetic field Hex=0 (Oe).

As will be apparent from FIG. 2, a level Hp of the external magnetic field magnitude at which the impedance reaches the maximum value is approximately 6 (Oe). This indicates that the MI element has a high detection accuracy and its MI characteristics are asymmetrical with respect to positive side and negative side of the external field Hex.

In this characteristic diagram, the characteristic curve in solid line indicates the MI characteristics when the external magnetic field Hex is varied from negative side to positive side and the characteristic curve in dotted line indicates the MI characteristics when the external magnetic field Hex is varied from positive side to negative side.

Figure 3:
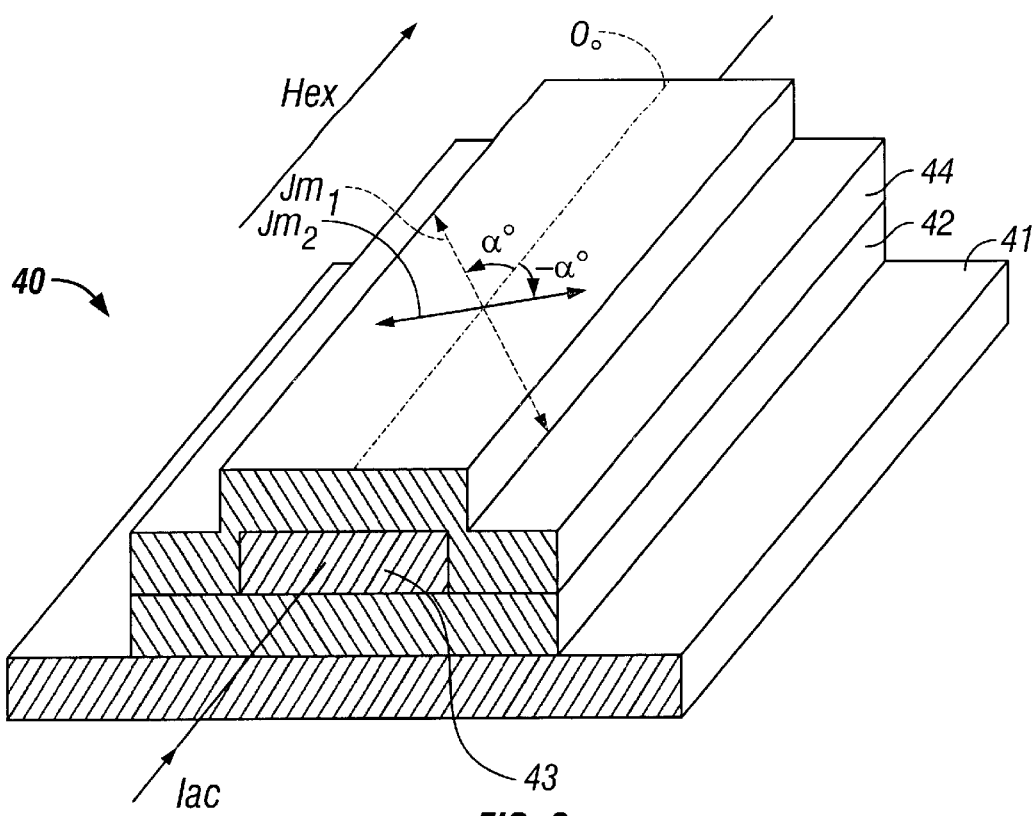
FIG. 3 is a perspective view partially showing a MI element made of thin film magnetic material according to a second embodiment of this invention.

FIG. 3 is a perspective view partially showing a second embodiment of the MI element made of thin film magnetic material.

This MI element 40 made of thin film magnetic material comprises a glass substrate 41, first magnetic material 42 sputtered on a surface of said glass substrate 41, conductive material 43 sputtered on a surface of said d first magnetic material 42 and second magnetic material 44 sputtered on a surface of said conductive material 43. Such assembly is then subjected to a process of photolithographic patterning to obtain a MI element 40 of laminate construction.

The conductive material 43 is dimensioned to be narrower than both the first and second magnetic materials 42, 44 and to be wrapped by said second magnetic material 44.

The first and second magnetic materials may be selected from a group of soft magnetic materials such as amorphous magnetic material, permalloy and microcrystalline material and the conductive material may be selected from a group of nonmagnetic and low resistance materials such as Cu, Au and Al.

In the MI element 40 made of thin film magnetic material constructed as has been described above, the first magnetic material 42 has its axis of easy magnetization $Jm_1$ extending at an angle of $\alpha°$ and the second magnetic material 44 has its axis of easy magnetization $Jm_2$ extending at an angle of $-\alpha$ with respect to a reference line $O_o$ corresponding to a direction of current path.

To achieve such angular relationship, thin film of the first magnetic material 42 is formed under effect of a magnetic field given by a permanent magnet in a direction defined by said angle $\alpha°$ with respect to said reference line $O_o$ and thin film of the second magnetic material 44 is formed under effect of a magnetic field given by the permanent magnet in a direction defined said angle $-\alpha°$ with respect to said reference line $O_o$.

The MI element 40 made of thin film magnetic material constructed in this manner detects, similar to said MI element 30 made of thin film magnetic material, an external magnetic field Hex applied thereto in a direction of said reference line $O_o$ when said conductive material 43 is supplied with a high frequency current Iac superposed with DC current.

Figure 4:
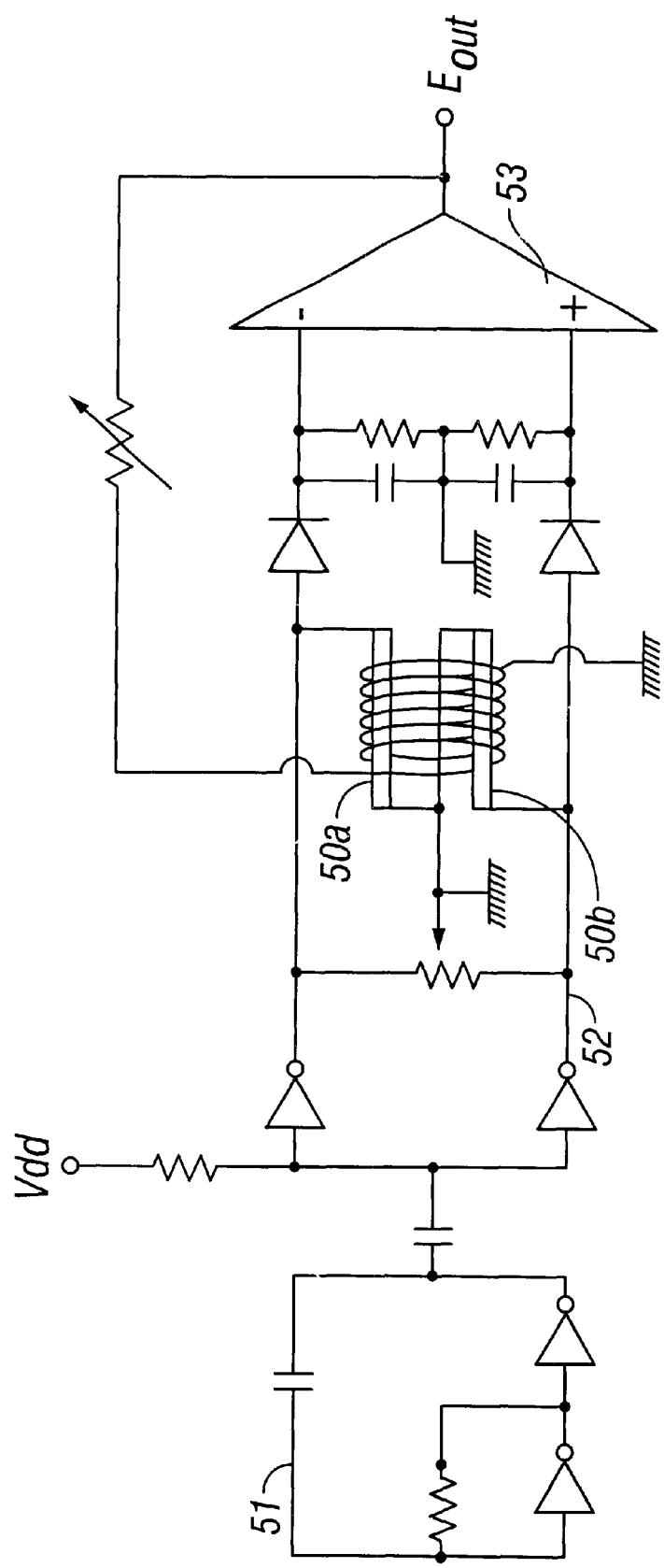
FIG. 4 is a circuit diagram illustrating a magnetic field sensor circuit provided with a pair of MI elements made of thin film magnetic material adapted to be excited by pulse current.

FIG. 4 is a circuit diagram of a magnetic field sensor circuit including a pair of MI elements 50a, 50b made of thin film magnetic material similar to said MI elements 30, 40 made of thin film magnetic material so that an external magnetic field may be detected when said MI elements 50a, 50b are supplied with pulse current.

This magnetic field sensor circuit comprises a negative feedback C–MOS multivibrator circuit incorporated with the pair of MI elements 50a, 50b.

More specifically to describe, the magnetic field sensor circuit comprises a pulse oscillator section 51, a sensor section 52 and a differential amplifier section 53, wherein said sensor section 52 is said pair of MI elements 50a, 50b.

Figure 5:
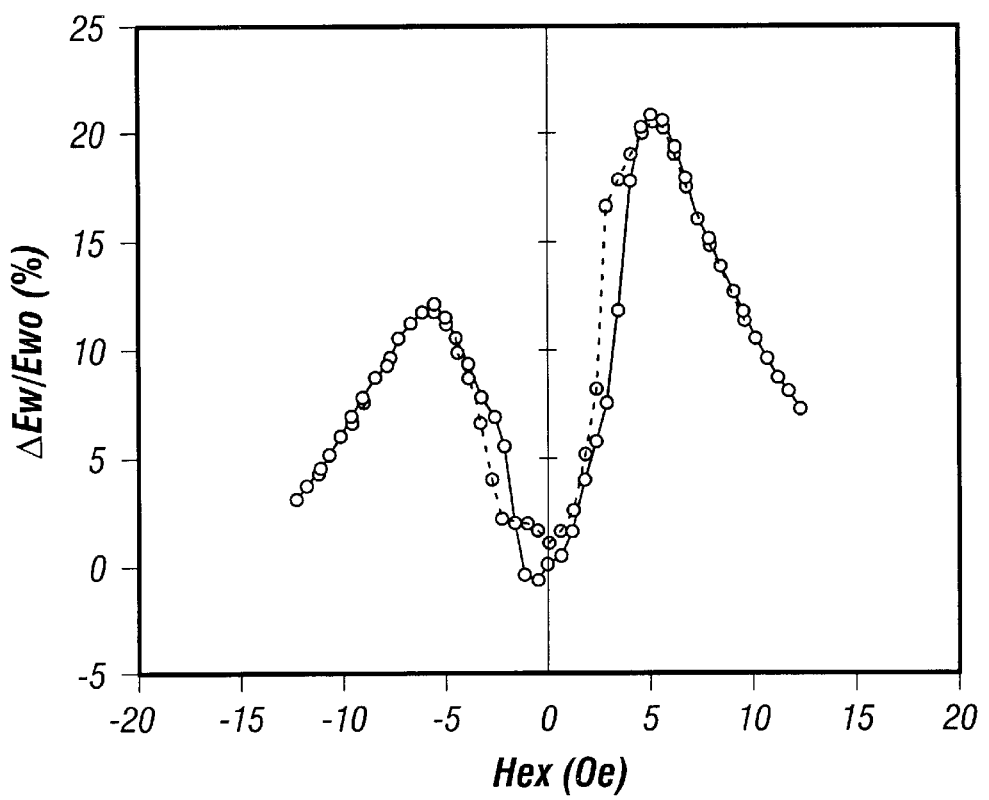
FIG. 5 is a graphic diagram plotting MI characteristics exhibited by said MI elements made of magnetic material incorporated in said magnetic field sensor circuit.

One of these MI elements 50a, 50b, the MI element 50a has asymmetrical MI characteristics exhibiting the maximum impedance on positive side of the external magnetic field and the other MI element 50b has asymmetrical MI characteristics exhibiting the maximum impedance on negative side of the external magnetic field as illustrated by FIG. 5.

Figure 6:
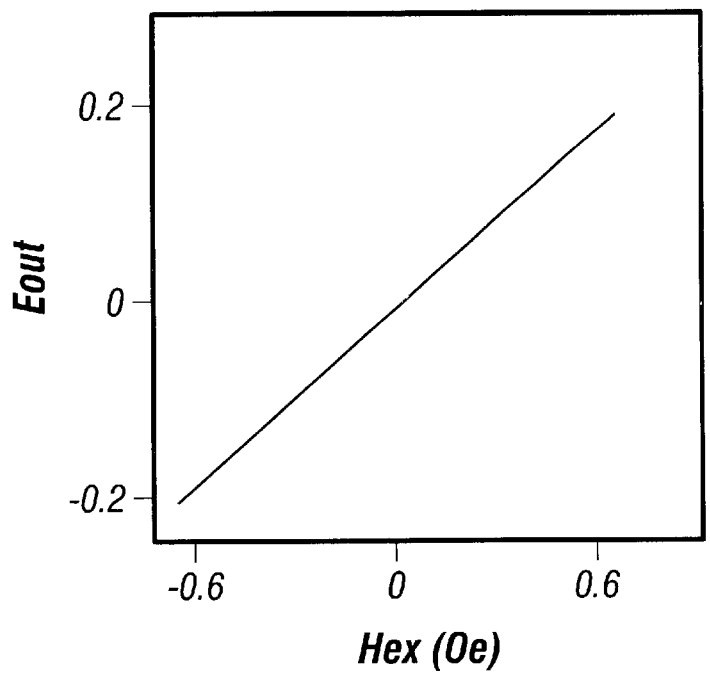
FIG. 6 is a waveform diagram illustrating output voltage of said magnetic field sensor circuit.
Figure 7:
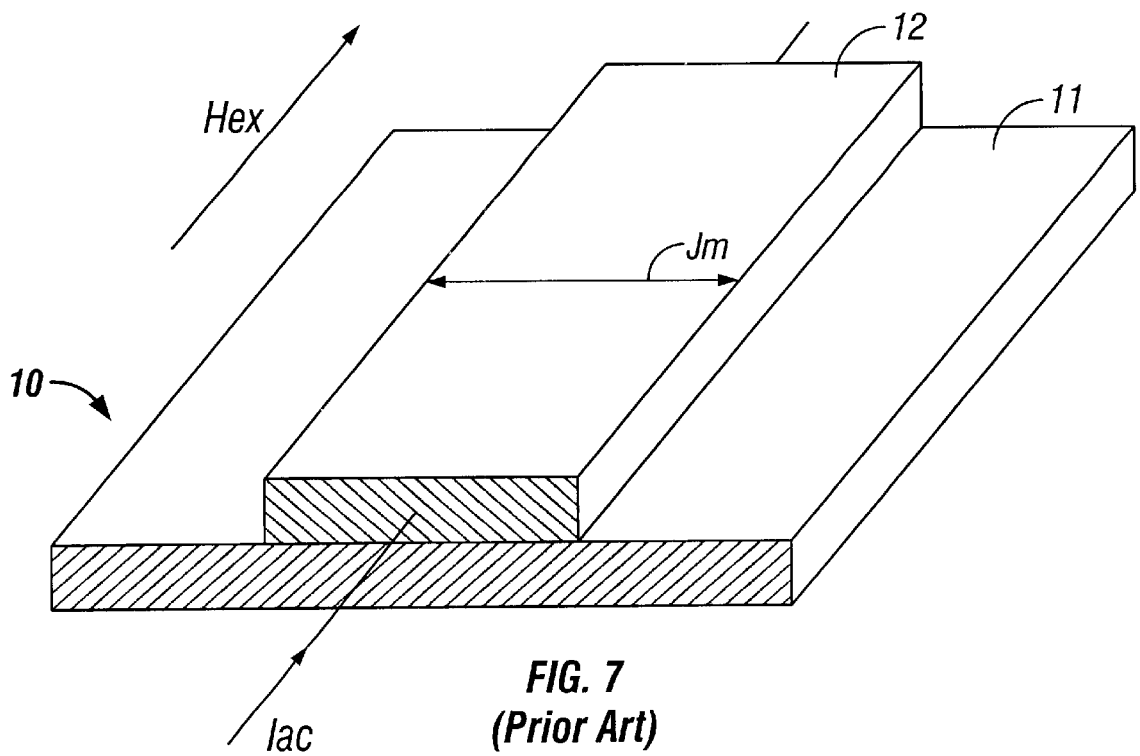
FIG. 7 is a perspective view partially showing an example of well known MI element made of thin film magnetic material.
Figure 8:
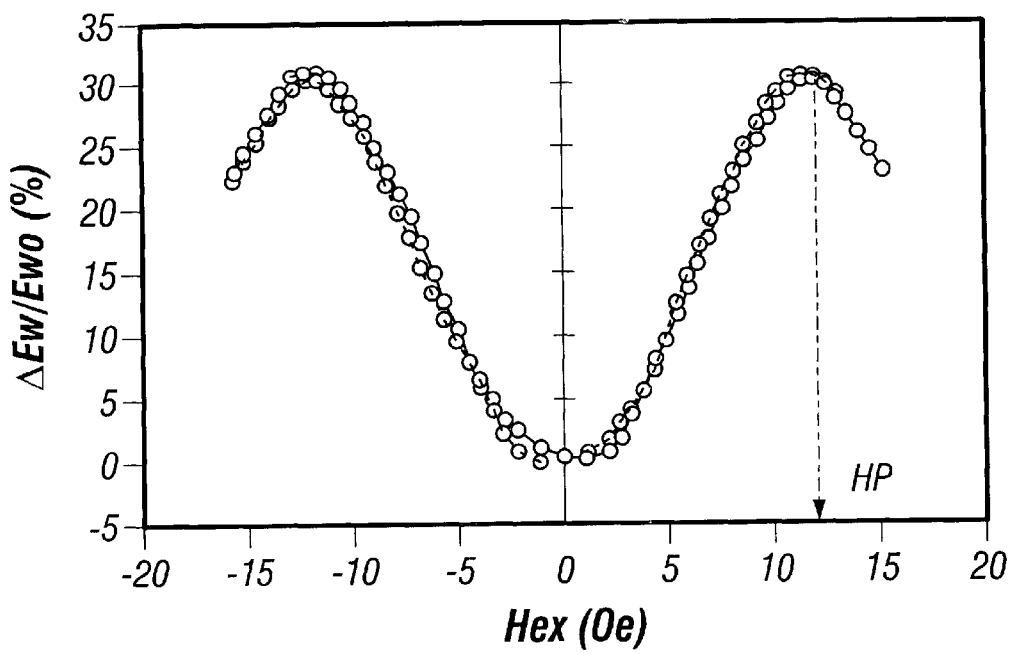
FIG. 8 is a graphic diagram plotting MI characteristics exhibited by said MI element made of thin film magnetic material of prior art.
Figure 9:
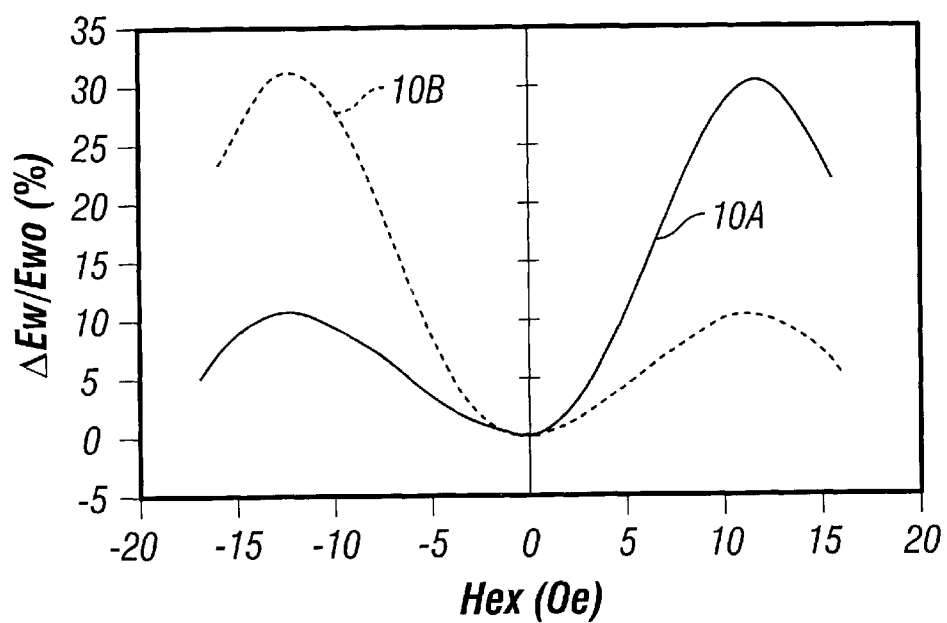
FIG. 9 is a graphic diagram plotting MI characteristics exhibited by a pair of MI elements incorporated in the magnetic field sensor circuit.
Figure 10:
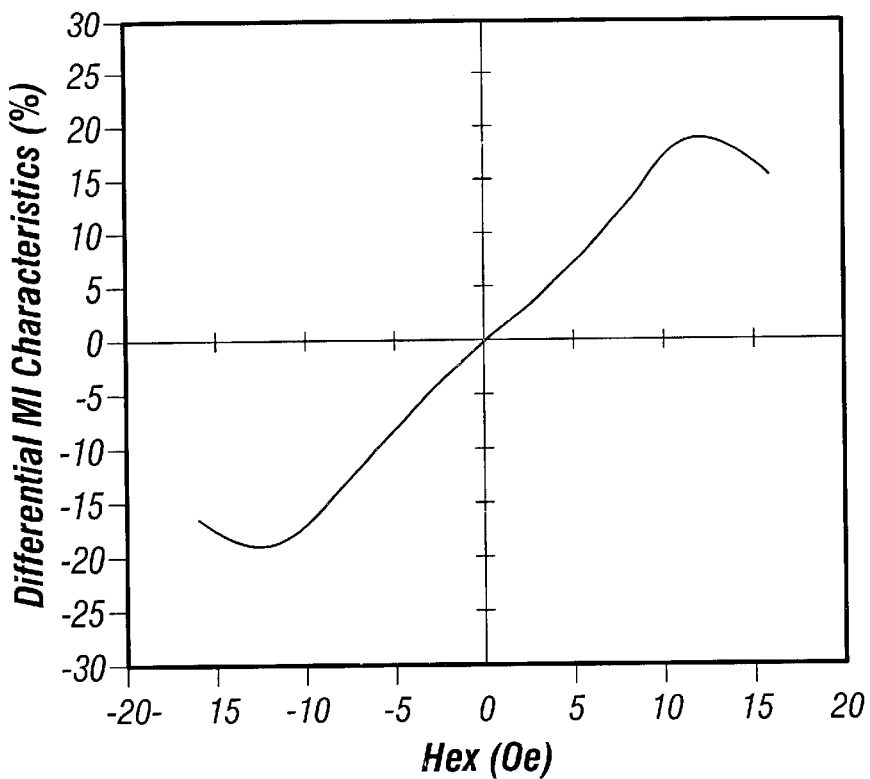
FIG. 10 is a graphic diagram plotting linear signals output from the magnetic field sensor circuit.
Figure 11:
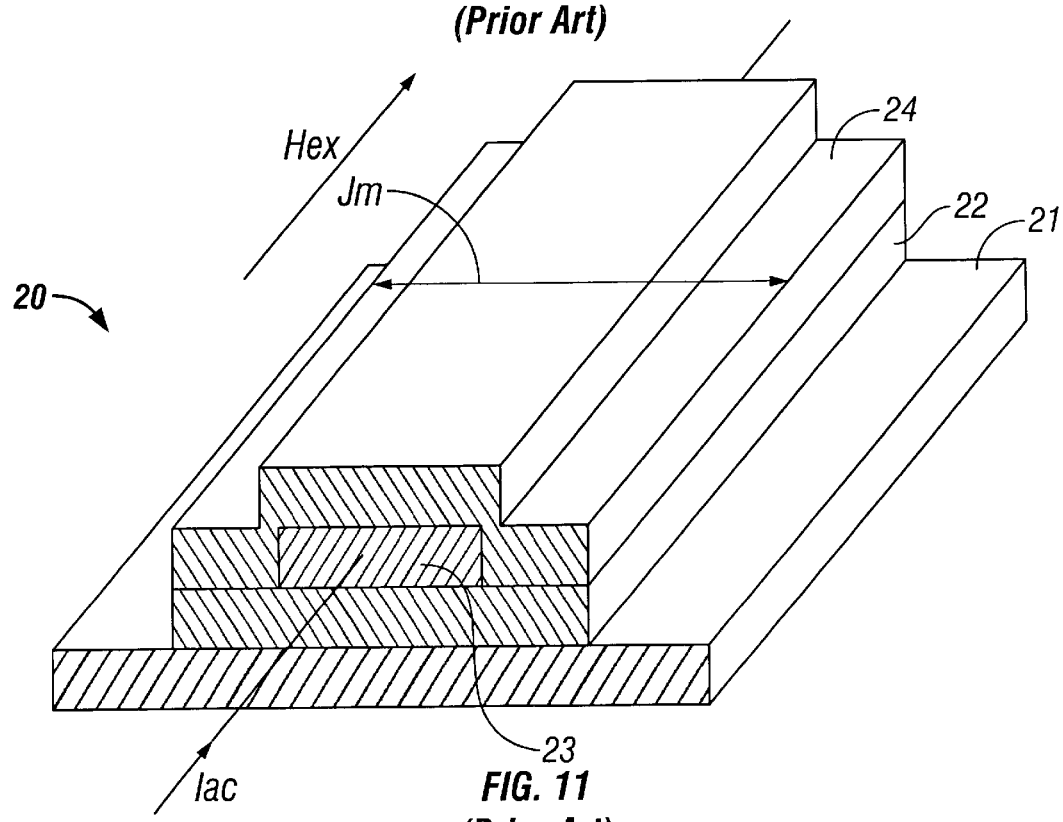
FIG. 11 is a perspective view partially showing another example of the well known MI element made of thin film magnetic material.

Accordingly, as shown in FIG. 6, a differential MI effect of these two MI elements 50a, 50b is calculated by the differential amplifier 53 of which the output Eout forms a linear voltage signal depending on the external magnetic field Hex.

While this invention has been described by way of specific embodiments, it is also possible without departing from the scope of the invention to arrange so that the first magnetic material (32, 42) has its axis of easy magnetization $Jm_1$ extending at an angle of $-\alpha°$ and the second magnetic material (33, 44) has its axis of easy magnetization $Jm_2$ extends at an angle of $\alpha°$.

It is not essential that the angle (declination) $\alpha°$ of the axis of easy magnetization $Jm_1$ and the angle (declination) $-\alpha°$ of the axis of easy magnetization $Jm_2$ are in a relationship of $\alpha°=|-\alpha°|$ but these two angles may be in a relationship of $\alpha°\neq|\alpha°\cdot\alpha°$ or $|-\alpha°|$ can be adjusted to the most effective angle in a range of $0°<\alpha°<180°$.

As will be apparent from the foregoing description, the MI element made of thin film magnetic material according to this invention exhibits a sufficiently remarkable variation of impedance in response to a relatively low external magnetic field to be used as a high accuracy magnetic field sensor. In addition, the novel MI element requires no bias magnetic field generated by a fixed magnet or coil current and provides a linear magnetic field sensor of energy consumption saving type, since its MI characteristics are asymmetrical with respect to positive side and negative side of the external magnetic field.

What is claimed is:

1. A MI element made of thin film magnetic material utilizing a magnetic impedance effect comprising a substrate, first and second magnetic as well as conductive first and second materials successively laminated on a surface of said substrate each in the form of thin film wherein said first magnetic material has its axis of easy magnetization declined in one direction with respect to a direction of current path and said second magnetic material has its axis of easy magnetization declined in the other direction with respect to said direction of current path so that the axes of easy magnetization of said first and second magnetic materials may intersect each other.

2. A MI element made of thin film magnetic material utilizing a magnetic impedance effect comprising a substrate and a first magnetic material, conductive material and second magnetic material successively laminated on a surface of said substrate each in the form of thin film wherein said first magnetic material has its axis of easy magnetization declined in one direction with respect to a direction of current path and said second magnetic material has its axis of easy magnetization declined in the other direction with respect to said direction of current path so that the axes of easy magnetization of said first and second magnetic materials may intersect each other.

3. A MI element made of thin film magnetic material according to claim 1 or 2, wherein said first magnetic material has its axis of easy magnetization declined at an angle of $\alpha°$ and the second magnetic material has its axis of easy magnetization declined at an angle of $-\alpha°$ with respect to a direction of current path so that these axes of the first and second magnetic materials intersect each other.

4. A MI element made of thin film magnetic material according to claim 3, wherein the angles $\alpha°$ and $-\alpha°$ at which the axes of easy magnetization of the first and second magnetic materials are declined are selected in a range of $0°<\alpha°<180°$.

5. The MI element of claim 1, wherein the MI element is supplied with an electrical current.

6. The MI element of claim 5, wherein the electrical current supplied to the MI element produces an asymmetrical MI effect with respect to a positive side and a negative side of an external magnetic field.

7. The MI element of claim 5, wherein the electrical current is selected from the group consisting of a high frequency current superposed with DC current, and a pulse current.

8. The MI element of claim 2, wherein the MI element is supplied with an electrical current through the conductive material.

9. The MI element of claim 8, wherein the electrical current supplied to the MI element through the conductive material produces an asymmetrical MI effect with respect to a positive side and a negative side of an external magnetic field.

10. The MI element of claim 8, wherein the electrical current supplied to the MI element through the conductive material is selected from the group consisting of a high frequency current superposed with DC current, and a pulse current.

11. An MI element comprising:

a first thin film magnetic material having a first axis of easy magnetization;

a second thin film magnetic material assembled together with the first thin film magnetic material, the second thin film magnetic material having a second axis of easy magnetization; and apparatus operable to supply an electrical current in a current path direction through the first and second magnetic materials;

wherein the first axis of easy magnetization is declined in a first direction with respect to the current path direction;

wherein the second axis of easy magnetization is declined in a second direction with respect to the current path direction; and wherein the first and second directions are different from one another.

12. The MI element of claim 11, wherein the apparatus operable to supply the electrical current is operable to supply a current that produces an asymmetrical effect with respect to a positive side and a negative side of an external magnetic field.

13. The MI element of claim 11, wherein the apparatus operable to supply the electrical current is operable to supply an electrical current selected from the group consisting of a high frequency current superposed with DC current, and a pulse current.

14. The MI element of claim 11, wherein the first axis of easy magnetization is declined at an angle of $\alpha°$ with respect to the current path direction, and the second axis of easy magnetization is declined at an angle of −α° with respect to the current path direction.

15. An MI element comprising:

a first thin film magnetic material having a first axis of easy magnetization;

a thin film nonmagnetic conductive material assembled together with the first thin film magnetic material;

a second thin film magnetic material assembled together with the first thin film magnetic material and the thin film nonmagnetic conductive material so that the thin film nonmagnetic conductive material is wrapped within the first and second thin film magnetic materials, the second thin film magnetic material having a second axis of easy magnetization;

apparatus operable to supply an electrical current in a current path direction through the thin film nonmagnetic conductive material;

wherein the first axis of easy magnetization is declined in a first direction with respect to the current path direction; and wherein the second axis of easy magnetization is declined in a second direction with respect to the current path direction; and wherein the first and second directions are different from one another.

16. The MI element of claim 15, wherein the apparatus operable to supply the electrical current is operable to supply a current that produces an asymmetrical effect with respect to a positive side and a negative side of an external magnetic field.

17. The MI element of claim 15, wherein the apparatus operable to supply the electrical current is operable to supply an electrical current selected from the group consisting of a high frequency current superposed with DC current, and a pulse current.

18. The MI element of claim 15, wherein the first axis of easy magnetization is declined at an angle of α° with respect to the current path direction, and the second axis of easy magnetization is declined at an angle of −α° with respect to the current path direction.

* * * * *